US00RE47398E

(19) United States
(12) Reissued Patent
Chang et al.

(10) Patent Number: US RE47,398 E
(45) Date of Reissued Patent: May 21, 2019

(54) LIGHT-EMITTING DEVICE HAVING PATTERNED SUBSTRATE AND METHOD OF MANUFACTURING THEREOF

(71) Applicant: EPISTAR CORPORATION, Hsinchu (TW)

(72) Inventors: Chung-Ying Chang, Zhongli (TW); Dennis Wang, Tainan (TW); Jenq-Dar Tsay, Kaohsiung (TW)

(73) Assignee: Epistar Corporation, Hsinchu (TW)

(21) Appl. No.: 15/593,043

(22) Filed: May 11, 2017

Related U.S. Patent Documents

Reissue of:
(64) Patent No.: 9,029,890
Issued: May 12, 2015
Appl. No.: 13/547,347
Filed: Jul. 12, 2012

(51) Int. Cl.
*H01L 33/20* (2010.01)
*H01L 33/00* (2010.01)

(52) U.S. Cl.
CPC ..... *H01L 33/20* (2013.01); *H01L 33/007* (2013.01)

(58) Field of Classification Search
CPC ..... H01L 33/20; H01L 33/007
See application file for complete search history.

(56) References Cited

U.S. PATENT DOCUMENTS

| | | | | |
|---|---|---|---|---|
| 6,091,085 | A | 7/2000 | Lester | |
| 6,870,191 | B2 | 3/2005 | Niki et al. | |
| 7,825,577 | B2 * | 11/2010 | Hsu | H01L 33/007 313/498 |
| 8,384,111 | B2 | 2/2013 | Tadatomo et al. | |
| 2004/0232428 | A1 * | 11/2004 | Senda et al. | 257/79 |
| 2005/0179130 | A1 * | 8/2005 | Tanaka et al. | 257/730 |
| 2007/0206130 | A1 * | 9/2007 | Wuu et al. | 349/88 |
| 2011/0193122 | A1 * | 8/2011 | Yuh | 257/98 |
| 2011/0316004 | A1 | 12/2011 | Yoon et al. | |
| 2012/0138985 | A1 * | 6/2012 | Ono | H01L 21/0243 257/98 |

FOREIGN PATENT DOCUMENTS

| | | | |
|---|---|---|---|
| CN | 101504964 | A | 8/2009 |
| CN | 102237459 | B | 1/2013 |
| CN | 102362018 | B | 6/2015 |

* cited by examiner

*Primary Examiner* — Leonardo Andujar
(74) *Attorney, Agent, or Firm* — Ditthavong & Steiner, P.C.

(57) ABSTRACT

A light-emitting device disclosed herein comprises a patterned substrate having a plurality of cones, wherein a space is between two adjacent cones. A light-emitting stack formed on the cones. Furthermore, the cones comprise an area ratio of a top area of the cone and a bottom area of the cone which is less than 0.0064.

31 Claims, 7 Drawing Sheets

| Spec | H(μm) | D1(μm) | S(μm) | S/(D1+S) | slanted angle θ(degree) |
|---|---|---|---|---|---|
| I | 1.5 | 2.45 | 0.8 | 0.25 | 50.8 |
| III | 1.5 | 2.65 | 0.4 | 0.13 | 48.5 |

FIG. 5A

| Spec | XRD WHM (arcsec) | Output power (mw) |
|---|---|---|
| I | 316 | 367 |
| III | 311 | 388 |

FIG. 5B

LIGHT-EMITTING DEVICE HAVING PATTERNED SUBSTRATE AND METHOD OF MANUFACTURING THEREOF

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

REFERENCE TO RELATED APPLICATION

*The present application is a Re-issue Application of U.S. Pat. No. 9,029,890, issued on May 12, 2015, and filed as application Ser. No. 13/547,347 on Jul. 12, 2012, the entire contents of which are incorporated herein by reference.*

1. Technical Field

This present application relates to a light-emitting device, and more particularly to a light-emitting device having a patterned substrate and the method of manufacturing.

2. Background of the Disclosure

Recently, efforts have been devoted to improve the luminance of the light-emitting diode (LED) in order to apply the device to the lighting domain, and further procure the goal of energy conservation and carbon reduction. There are two major aspects to improve luminance. One is to increase the internal quantum efficiency (IQE) by improving the epitaxy quality to enhance the combination efficiency of electrons and holes. The other is to increase the light extraction efficiency (LEE) that emphasizes on the light emitted from light-emitting layer and therefore reducing the light absorbed by the LED structure.

Surface roughening technology is one of the efficient methods to enhance luminance, and a well-known method is to form a patterned substrate. The light emitted from the active layer on the patterned substrate is easily reflected back to the epitaxial stack because of total internal reflection (TIR) effect and absorbed by the epitaxial stack to generate heat. It causes both the poor light extraction efficiency and the heat dissipation. Nevertheless, the pattern on the substrate is usually formed deeper in order to compensate the light loss due to the internal total reflection effect, but the high aspect ratio of the deeper pattern on the substrate causes difficulty for subsequently epitaxial growth and adversely affects the epitaxial quality.

Another prior technique to roughen surface is to utilize mechanically polishing method to form a randomly distributed rough patterns on the substrate surface. By this method, it is hard to control the pattern dimension such as the depth or the width. Moreover, the epitaxy quality is poor for an epitaxial layer grown on the randomly rough surface.

SUMMARY OF THE DISCLOSURE

One aspect of the disclosure proposes a light-emitting device having a patterned substrate. The patterned substrate benefits both quality of epitaxial layer and light extraction efficiency.

One aspect of the present disclosure provides a light-emitting device, comprising a patterned substrate having a plurality of cones, wherein each of the plurality of comes comprises a top having a top width, a bottom having a bottom width, and a sidewall between the top and the bottom, and a height H, wherein an area ratio of the top and the bottom of the cone is less than 0.0064 and H>1.5 μm; and a light-emitting stack formed on the cones, wherein the light-emitting stack comprises a first conductivity-type semiconductor layer, an active layer, and a second conductivity-type semiconductor layer.

BRIEF DESCRIPTION OF THE DRAWINGS

FIG. 5A shows a table describing LEDs designed with two different cone sizes.

FIG. 5B shows a table describing output measurement results for LEDs designed with two different cone sizes.

DETAILED DESCRIPTION OF THE PREFERRED EMBODIMENTS

Figure 1A:
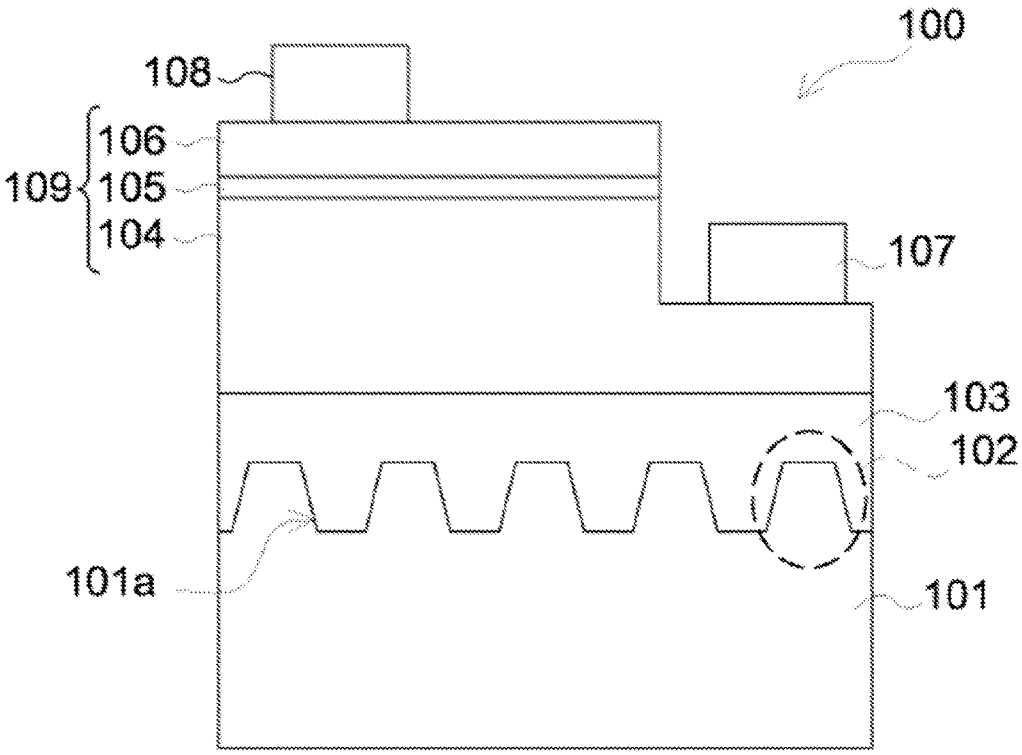
FIGS. 1A-1B shows a light-emitting device in accordance with one embodiment of the present disclosure.

FIG. 1A shows a light-emitting device (LED) in accordance with one embodiment of the present disclosure. The LED 100 comprises a growth substrate 101, an epitaxial stack 109, a first electrode 107, and a second electrode 108. The cross-section of the substrate 101 shows a plurality of cones 102. In the embodiment, the LED 100 comprises an intermediate layer 103 grown on the substrate 101, and an epitaxial stack 109 grown on the intermediate layer 103.

The intermediate layer 103 can be a buffer layer used to reduce the lattice mismatch between the substrate 101 and the epitaxial stack 109. The intermediate layer 103 can also be a single layer, multiple layers, or a structure to combine two materials or two separated structures where the material can be organic, inorganic, metal, semiconductor and so on, and the structure can be a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure and so on.

The epitaxial stack 109 comprises a first semiconductor layer 104 with a first conductivity-type grown on the intermediate layer 103 which comprises non-doped semiconductor layer or doped semiconductor layer, an active layer 105 grown on the first semiconductor layer 104, a second semiconductor layer 106 with a second conductivity-type grown on the active layer 105. The first electrode 107 is formed on the first semiconductor layer 104 after etching the epitaxial stack 109 until a part of semiconductor layer 104 is exposed, and the second electrode 108 is formed on the second semiconductor layer 106. In another embodiment, the first electrode 107 is formed on one side of the growth substrate 101 opposite to another side attached to the epitaxial stack 109.

Figure 1B:
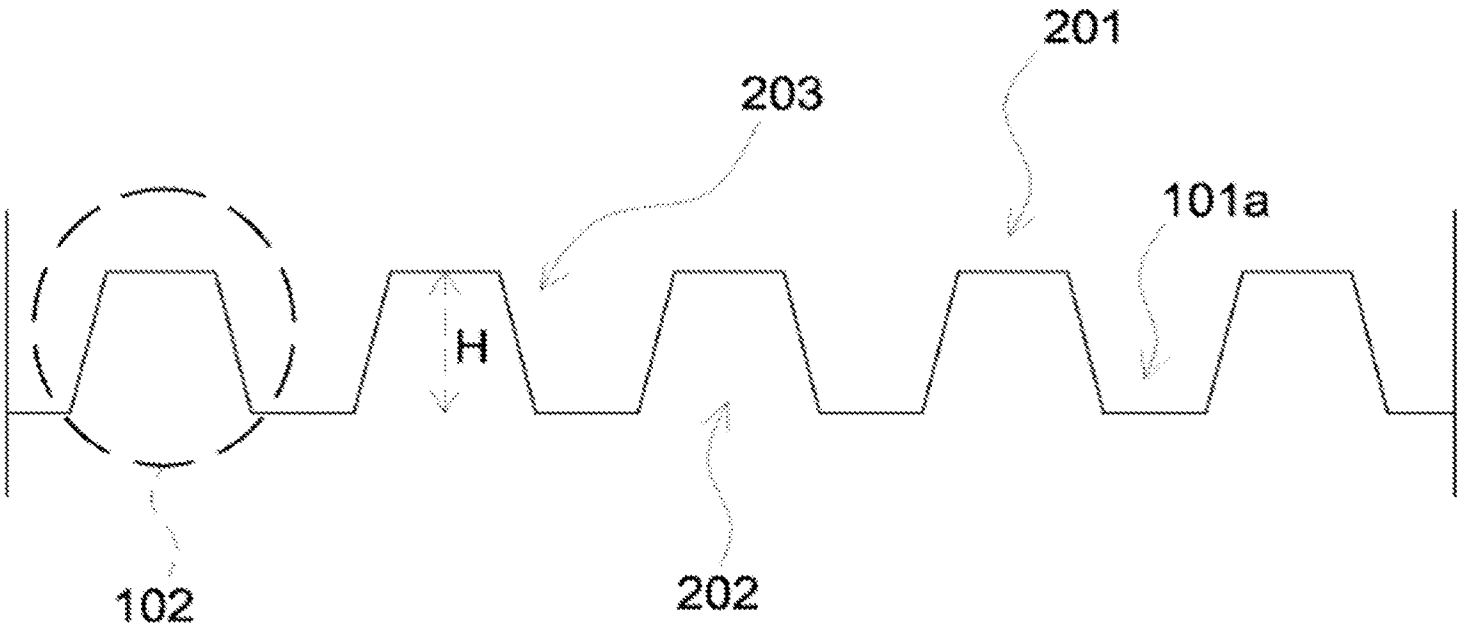

Substrate 101 comprises a plurality of cones 102 with a spacing 101a between two adjacent cones 102, wherein each cone 102 comprises a top 201, a bottom 202, and an inclined sidewall 203 between the top 201 and the bottom 202 as shown in FIG. 1B. The shape of the top 201 and the bottom 202 surrounded by the inclined sidewall comprises a circle from top view. Each of the plurality of cones 102 is disposed on the substrate in a predetermined period. The predetermined period can be a fixed period, or a variable period, or a quasi-period. In other words, the spacing 101a between two adjacent cones 102 on the substrate 101 is regular or irregular.

Figure 2:
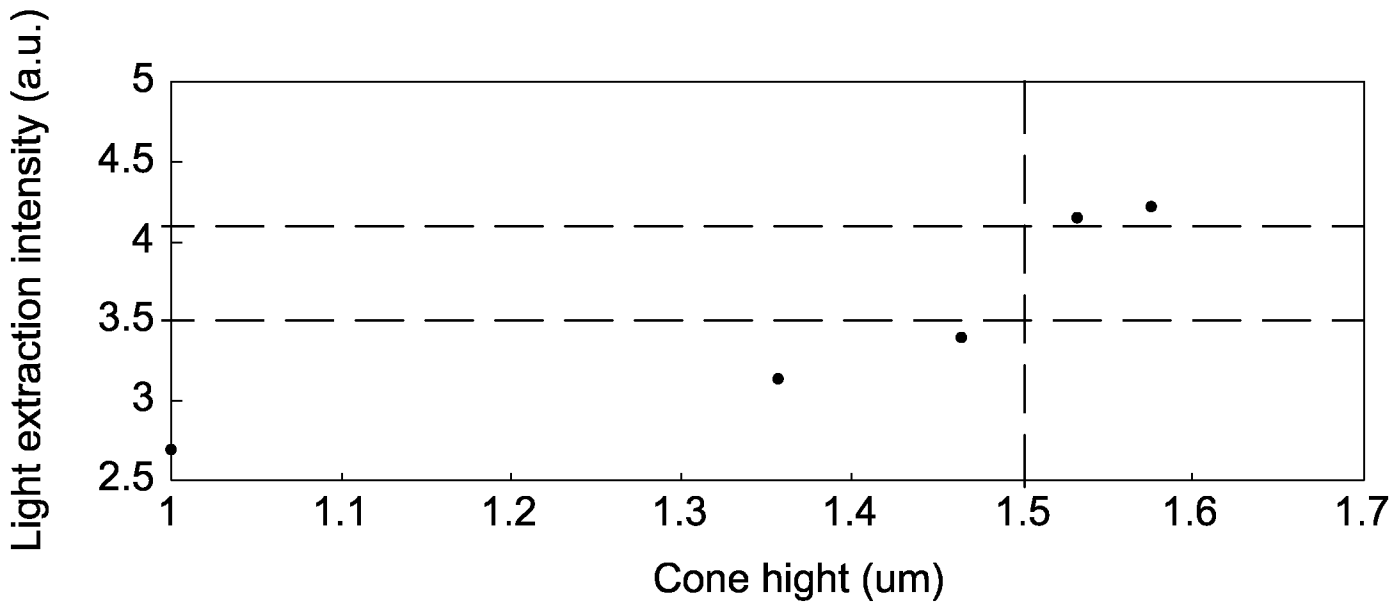
FIG. 2 shows the relationship between light extraction intensity and the height of cones in the light emitting device in accordance with an embodiment of the present disclosure.

FIG. 2 shows the light extraction intensity versus the height H of the cone 102 in accordance with the embodiment shown in FIG. 1B. The LEDs measured in FIG. 2 are designed with similar bottom area and bottom shape. As shown in FIG. 2, the light extraction intensity increases with a larger height H of the cone. Moreover, an apparent light extraction intensity gap exists if the height H of cone is larger than 1.5 μm, which implies that better light extraction intensity is derived once the LEDs are designed with substrate having cones of height H larger than 1.5 μm. Therefore, in a preferred embodiment, the LED expected to have better light extraction intensity is designed having cones with height H larger than 1.5 μm.

Figure 3:
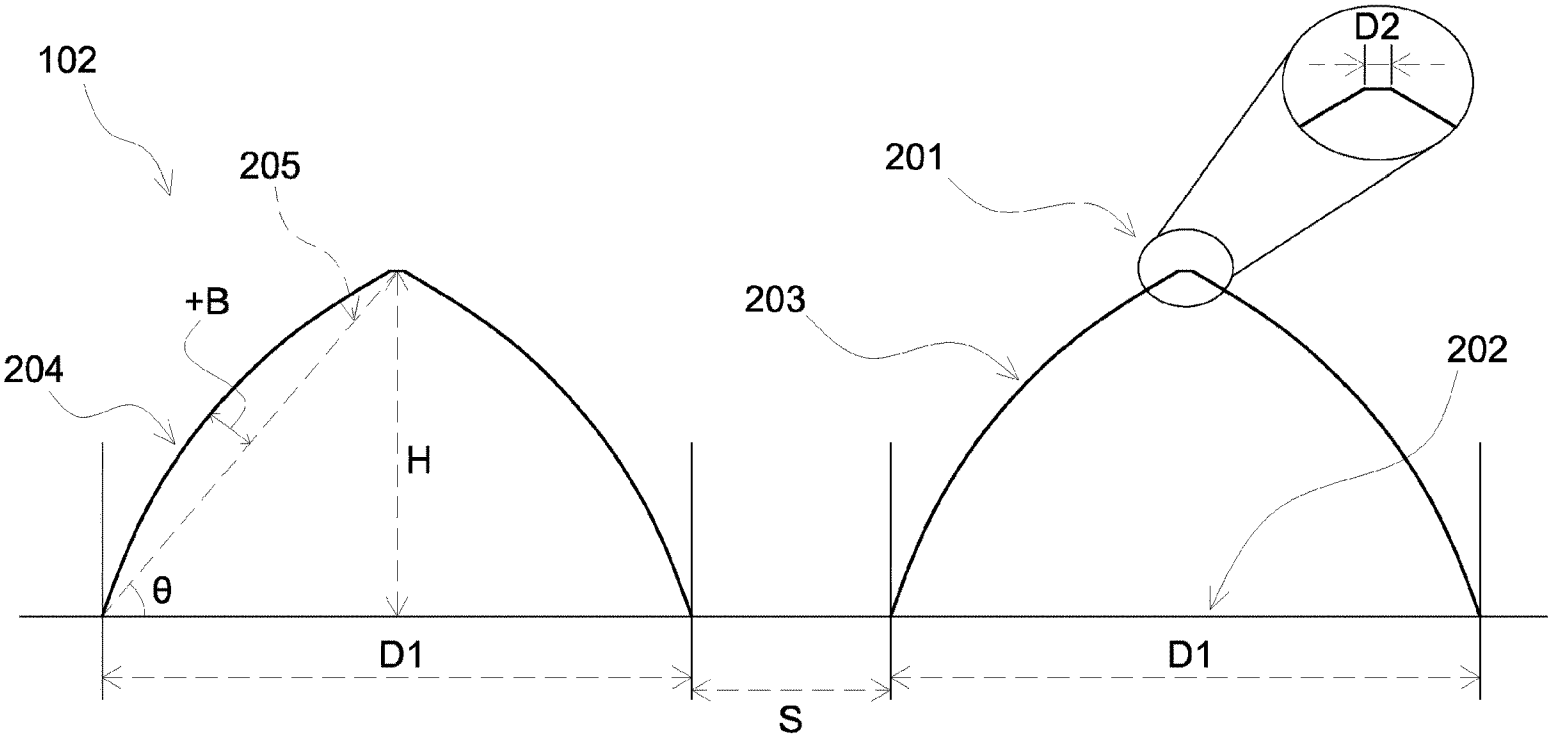
FIG. 3 shows cones in the light emitting device in accordance with the embodiment of the present disclosure.

FIG. 3 shows the cross-section of the cones 102 separated by the distance S as disclosed in another embodiment of the present application. As shown in FIG. 3, a cone 102 comprises a top 201, a bottom 202, and an inclined sidewall 203 with an arc 204 protruded outward and a chord 205, which is a curved surface from the top view. In order to increase the light extraction intensity, there are several variables to consider while forming cones 102 on the substrate 101, such as the bottom width D1 of the cone 102 wherein the bottom width D1 is defined as the largest distance between any two points on the circumference of the bottom of the cone 102, the height H which is defined as the largest distance between the top 201 and the bottom 202, the top width D2 of the cone 102 defined as the largest distance between any two points on the circumference of the top of the cone 102, which can be zero, the angle θ of the included angle between the chord 205 and the bottom 202, and the maximum distance B between the arc 204 and the chord 205 of the arc 204.

Referring to FIG. 2, the light extraction intensity increases as the height of the cone 102 on the substrate 101 is increased while the bottom area and bottom shape of the LEDs remain a fixed value. The LEDs having larger cones with larger bottom area indicates that more light falls on, and is diffused by, the cones 102 compared to the LEDs having smaller cones 102. Furthermore, in order to improve the light extraction intensity, the bottom area of each cone 102 is increased so the distance S between two adjacent cones 102 is decreased. In one embodiment, the top 201 comprises a plane. The space between two adjacent cones 102 and the plane of the top 201 can comprise a C plane suitable for epitaxial growth. The smaller the area of the C plane is, the longer it takes to grow the epitaxial layer with the same height. Besides, it is expected to have a larger bottom area to diffuse more light and a sufficient space between two adjacent cones 102 for growing the epitaxial layers. Thus, the distance S between two adjacent cones 102 is considered to be around 0.01-0.9 [nm] *μm* to ensure that the growth time of epitaxial layers does not take too long. In sum, the distance S between two adjacent cones 102 and the bottom width D1 of the cone 102 have a relationship represented by a first ratio Q1=S/(D1+S), wherein the ratio Q1 is about 0.01-0.3 in the embodiment. In a preferred embodiment, the distance S between two adjacent cones 102 is preferred to be 0.1-0.4 μm and the first ratio Q1 is preferred to be between 0.03-0.15.

As shown in FIG. 3, cones 102 with an arc 204 protruding from the inclined sidewall 203 enhance the light extraction because the amount of light falling on the cones 102 is increased and more light is diffused. Based on Snell's Law total internal reflection happens within the cone 102 at the intersection between the intermediate layer 103 and the cone 102 because the refractive index of the intermediate layer 103 is larger than that of the substrate 101. To sum up, due to the light diffused by the cones 102, the light extraction efficiency is increased.

As mentioned above, the larger the maximum distance B between the arc 204 and the chord 205 of the arc 204, the larger the surface area of the cone 102 for diffusing the light and increasing the light extraction efficiency. But a larger distance B can hinder the epitaxial layer from growing on the space (not shown) between two adjacent cones 102, and can increase the probability of the light being absorbed between adjacent cones 102. In one embodiment, the maximum distance B between the arc 204 and the chord 205 of the arc 204 can be 0-0.5 [nm] *μm*, and in another embodiment, it is expected to be 0-0.2 [nm] *μm* considering the growth of the epitaxial layers. Thus the spacing S between two adjacent cones 102, the maximum distance B between the arc 204 and the chord 205 of the arc 204 and the bottom width D1 of the cone 102 form a relationship represented by a second ratio Q2=B/(D1+S), which is used for preventing light absorption between adjacent cones 102 and to ensure a sufficient growth time for growing the epitaxial layers. The second ratio Q2 can be around 0-0.2, and preferably to be 0-0.05.

In order to avoid the light absorption due to the light reflection inside the cones 102 of substrate 101 caused by the difference between refractive index between the intermediate layer 103 and the substrate 101, the top width D2 of the cone 102 is expected to be larger than 0. The larger top width D2 of the cone 102 implies a larger entrance for light to emit into cones 102, while the top width D2 of the cone 102 is between 0-(Wd/$n_{intermediate}$) nm wherein the Wd is the major wavelength of the internal light and the $n_{intermediate}$ is the refractive index of the intermediate layer 103. In one embodiment, the top width D2 of the cone 102 is smaller than 0.1 [nm] *μm*. In order to guide the light to the epitaxial stack 109 through the top 201 before being absorbed within the cone 102, the cone 102 is designed to have an angle θ between the bottom 202 of the cone 102 and the chord 205 of the arc 204 between 40°-60°, preferably to be about 48°.

As described above, with consideration of the light extraction efficiency and the growth rate of the epitaxial layers, a ratio of the top 201 area to the bottom 202 area is designed to be less than 0.0064. Thus the bottom width D1 and the top width D2 of the cone 102 has a relationship represented by a third ratio Q3=(D2/D1) between 0-0.08, preferably between 0-0.03.

According to the light extraction intensity shown in FIG. 2, the height H is expected to be larger to reflect more light. Moreover, the distance S between two adjacent cones 102 and the plane of the top 201 can be C plane suitable for epitaxial growth. Thus the height H, the distance S between two adjacent cones 102 and bottom width D1 form a relationship represented by a fourth ratio Q4=H/(D1+S). In one embodiment, the fourth ratio Q4 is between 0.4-0.6, and in a preferred embodiment, the fourth ratio Q4 is designed to be 0.5 for giving consideration to the growth rate of the epitaxial layers and the light extraction efficiency.

Figure 4A:
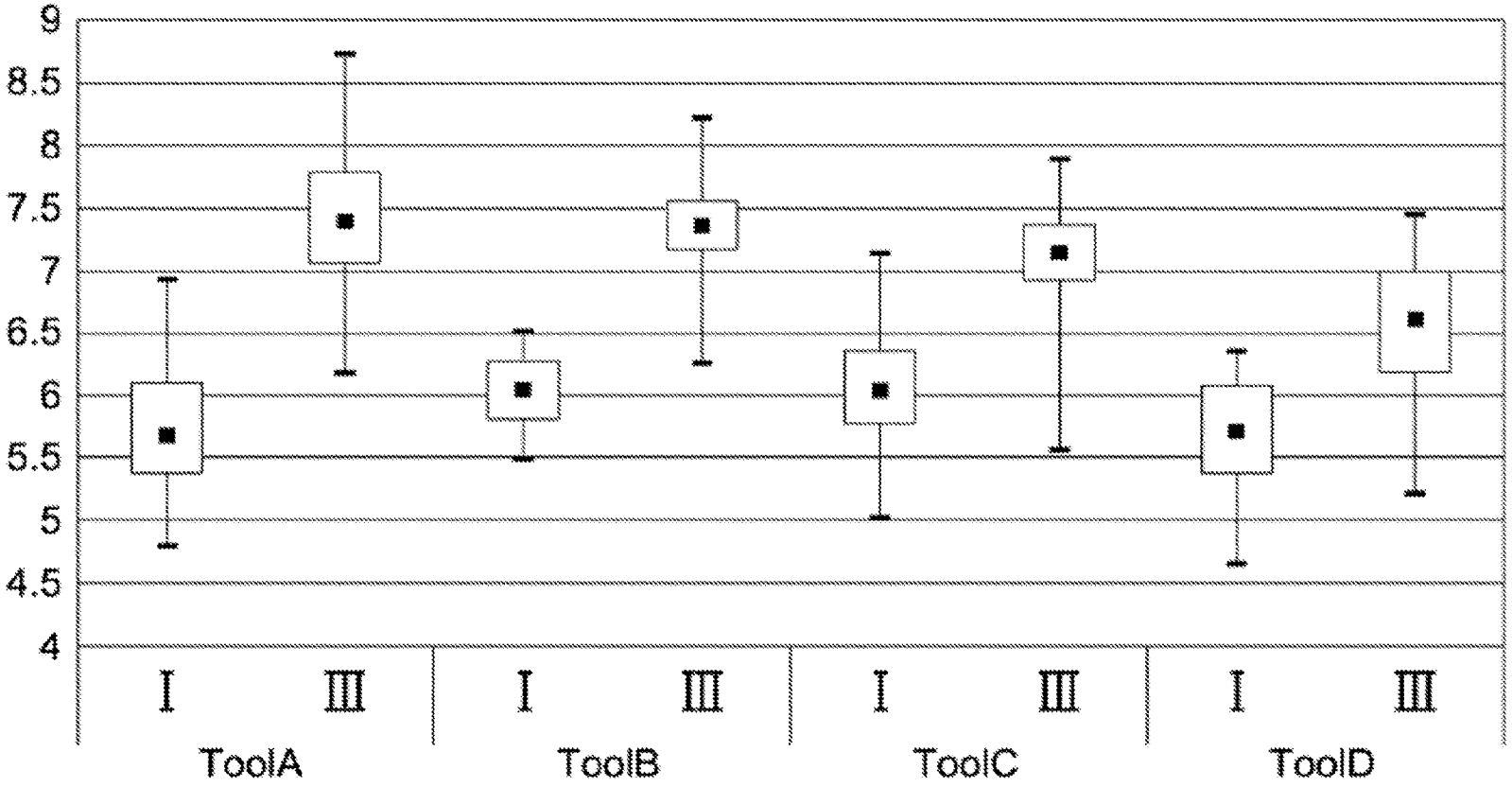
FIG. 4A shows the light extraction intensity measurement result of LEDs in accordance with the embodiments of the present disclosure.
Figure 4B:
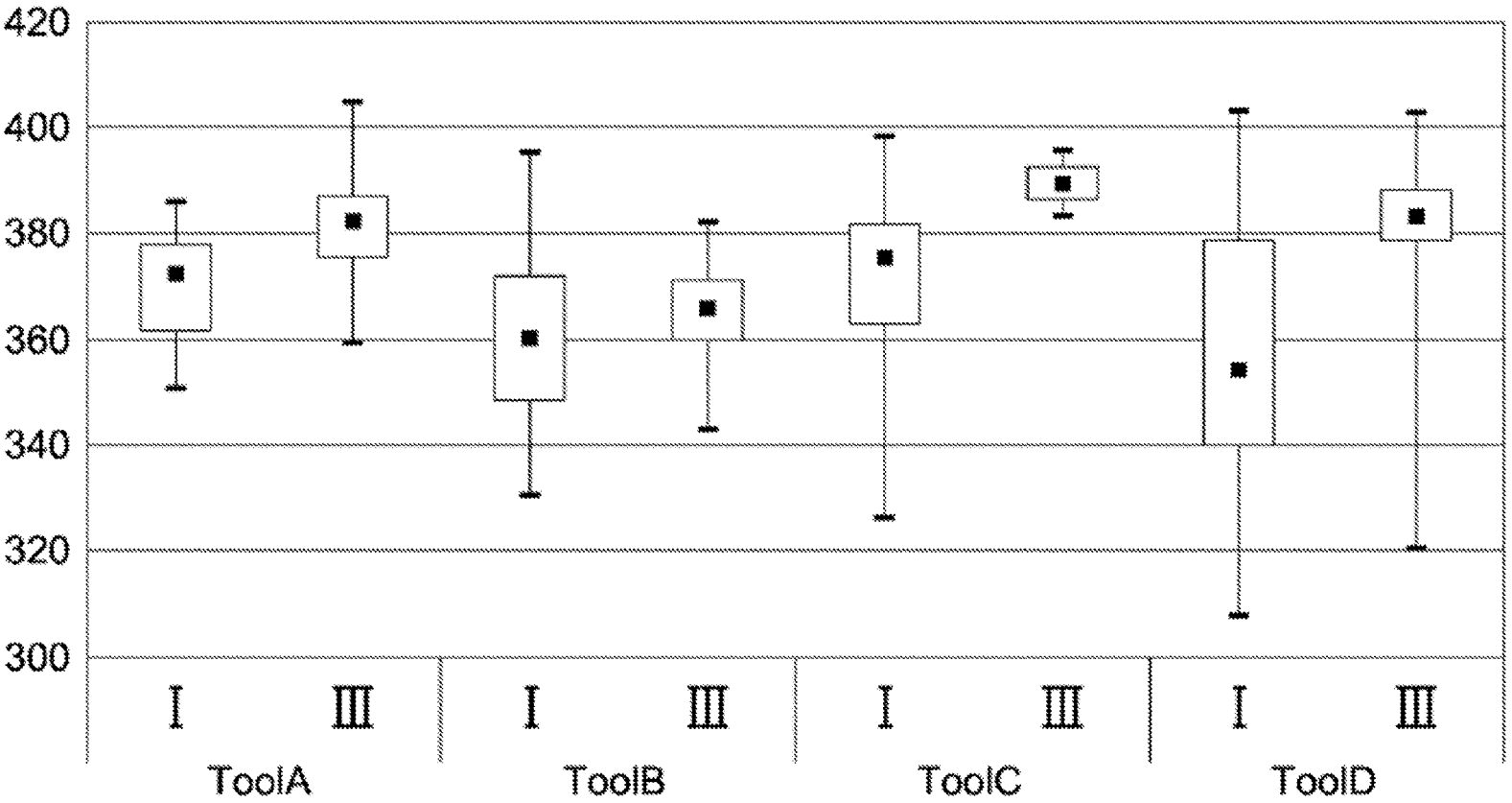
FIG. 4B shows the output power measurement result of LEDs in accordance with the embodiments of the present disclosure.

As shown in FIG. 5A, LEDs are designed with two different cone sizes designated as spec I and spec III. The LED of spec III has a patterned substrate with cone size having a first ratio Q1 of 0.13, and the LED of spec I has a patterned substrate of cone size having a first ratio Q1 of 0.25. FIGS. 4A and 4B show the measurement result, wherein the light extraction intensity indicated in FIG. 4A is increased about 20% for the LED of spec III comparing with that of the LED of spec I. As the output power measurement result shown in FIG. 4B and the average value listed in FIG. 5B, the LEDs of spec III have output power 3% larger than what LEDs of spec I have. Both of the two measurement results show the LED of spec III has better light extraction performance than that of the LED with spec I. To sum up, the LEDs of spec III having a first ratio Q1 of 0.13 which is between 0.03-0.15 have better light extraction efficiency than that of the LEDs of spec I having a first ratio Q1 of 0.25 which is between 0.01-0.3. In addition, the measurement results are classified by four tools in order to prove the differences of light characteristics of LEDs are irrelevant to the differences of facilities.

Furthermore, the quality of the epitaxial layers of the LEDs is verified by the factor of WHM (full width at half maximum) tested by XRD (X-ray diffraction) analysis. As shown in FIG. 5B, the LED of spec III has smaller XRD WHM value than that of the LED of spec I, which indicates the LED of spec III has better epitaxial quality. In sum, the LED of spec III not only has better lighting characteristics but also better epitaxial layer quality comparing with the LEDs of spec I.

It should be noted that the proposed various embodiments are not for the purpose to limit the scope of the disclosure. Any possible modifications without departing from the spirit of the disclosure may be made and should be covered by the disclosure.

The invention claimed is:

1. A light-emitting device, comprising:

a patterned substrate having a plurality of cones, wherein each of the plurality of cones comprises a top having a top width, a bottom having a bottom width, a sidewall between the top and the bottom, and a height H, wherein an area ratio of the top [and] *to* the bottom of the cone is less than 0.0064, and H>1.5 μm *and the top width is larger than zero*; and a light-emitting stack formed on the cones, wherein the light-emitting stack comprises a first conductivity-type semiconductor layer, an active layer, and a second conductivity-type semiconductor layer.

2. The light-emitting device according to claim 1, wherein the sidewall between the top and the bottom is inclined.

3. The light-emitting device according to claim 1, wherein [the] *a* shape of the top comprises a circle.

4. The light-emitting device according to claim 1, wherein [the] *a* shape of the bottom comprises a circle.

5. The light-emitting device according to claim 2, wherein a cross-section of the [inclined] sidewall comprises an arc with a chord protruded outward.

6. The light-emitting device according to claim 1, further comprising an intermediate layer having a refractive index formed on the patterned substrate.

7. The light-emitting device according to claim 6, wherein the top width is smaller than [the] *a* quotient of [the] *a* wavelength of light emitted from the light-emitting device divided by the refractive index of the intermediate layer.

8. The light-emitting device according to claim 1, wherein the top width of the cone is smaller than 0.1 μm.

9. The light-emitting device according to claim 5, further comprising a distance between two of the adjacent cones, wherein the distance is between 0.1-0.4 μm.

10. The light-emitting device according to claim 2, wherein an angle between the bottom of the cone and the chord of the arc is between 40-60 degrees.

11. The light-emitting device according to claim 9, wherein a maximum distance between the arc and the chord of the arc is smaller than 0.5 μm.

12. The light-emitting device according to claim 1, wherein a [first] ratio of the top width of the cone to the bottom width of the cone is smaller than 0.08.

13. The light-emitting device according to claim 1, wherein at least one of the cones satisfies 0.4<H/(D1+S) <=0.6, wherein D1 represents the bottom width of the cone, and S represents the distance between two of the adjacent cones.

14. The light-emitting device according to claim 9, wherein at least one of the cones satisfies 0.01<S/(D1+S) <0.3, wherein D1 represents the top width of the cone, and S represents the distance between two of the adjacent cones.

15. The light-emitting device according to claim 11, wherein at least one of the cones satisfies 0<B/([D 1] *D1*+S)<=0.2, wherein D1 represents the [top] *bottom* width of the cone, B represents the maximum distance of the arc and the chord of the arc, and S represents the distance between two of the adjacent cones.

[16. The light-emitting device according to claim 1, wherein the area of the top of the cone is zero.]

*17. The light-emitting device according to claim 1, wherein each of the plurality of cones is disposed on the patterned substrate in a predetermined period.*

*18. The light-emitting device according to claim 17, wherein the predetermined period comprises a fixed period, a variable period, or a quasi-period.*

*19. A light-emitting device, comprising:*

*a substrate comprising a plurality of cones, wherein each of the plurality of cones comprises a top having a top width, a bottom having a bottom width, a sidewall between the top and the bottom, and a height H, wherein an area ratio of the top to the bottom of the cone is less than 0.0064, and H>1.5 μm; and*

*wherein a cross-section of the sidewall comprises an arc with a chord protruded outward, and the one of the plurality of cones satisfies 0<B/(D1+S)<=0.2;*

*wherein D1 represents the bottom width, B represents a maximum distance between the arc and the chord, and S represents a distance between the one of the plurality of cones and another one of the plurality of cones adjacent to the one of the plurality of cones.*

*20. The light-emitting device according to claim 19, wherein an angle between the bottom and the chord of the arc is between 40-60 degrees.*

*21. The light-emitting device according to claim 19, wherein the maximum distance between the arc and the chord is smaller than 0.5 μm.*

*22. The light-emitting device according to claim 19, wherein a ratio of the top width to the bottom width is smaller than 0.08, and the top width is larger than zero.*

*23. The light-emitting device according to claim 19, wherein the one of the plurality of cones satisfies 0.4<H/(D1+S)<=0.6.*

*24. The light-emitting device according to claim 19, wherein the one of the plurality of cones satisfies 0.01<S/(D1+S)<0.3.*

*25. A light-emitting device, comprising:*

*a patterned substrate having a plurality of cones, wherein each of the plurality of cones comprises a top having a top width, a bottom having a bottom width, a sidewall between the top and the bottom, and a height H, wherein an area ratio of the top to the bottom of the cone is less than 0.0064, and H>1.5 μm; and*

*an intermediate layer having a refractive index formed on the patterned substrate;*

*wherein the top width is smaller than a quotient of a wavelength of light emitted from the light-emitting device divided by the refractive index of the intermediate layer, and the top width is larger than zero.*

*26. The light-emitting device according to claim 25, wherein a cross-section of the sidewall comprises an arc with a chord protruded outward, and an angle between the bottom and the chord of the arc is between 40-60 degrees.*

*27. The light-emitting device according to claim 25, wherein a maximum distance between the arc and the chord of the arc is smaller than 0.5 μm.*

*28. The light-emitting device according to claim 25, wherein a ratio of the top width to the bottom width is smaller than 0.08.*

*29. The light-emitting device according to claim 25, wherein the one of the plurality of cones satisfies* $0.4<H/(D1+S)<=0.6$*, wherein D1 represents the bottom width, and S represents a distance between the one of the plurality of cones and another one of the plurality of cones adjacent to the one of the plurality of cones.*

*30. The light-emitting device according to claim 25, wherein the one of the plurality of cones satisfies* $0.01<S/(D1+S)<0.3$*, wherein D1 represents the bottom width, and S represents a distance between the one of the plurality of cones and another one of the plurality of cones adjacent to the one of the plurality of cones.*

*31. The light-emitting device according to claim 30, wherein* $0.03<S/(D1+S)<0.15$*.*

*32. The light-emitting device according to claim 25, wherein an area ratio of the top to the bottom is less than 0.0064.*

* * * * *